US012591724B2

(12) United States Patent
Viswanath et al.

(10) Patent No.: US 12,591,724 B2
(45) Date of Patent: Mar. 31, 2026

(54) SMART SCAN OPTIONS TO IMPROVE WAFER DIE YIELD

(71) Applicant: TEXAS INSTRUMENTS INCORPORATED, Dallas, TX (US)

(72) Inventors: Rakul Viswanath, Bengaluru (IN); Sachin Aithal, Bengaluru (IN); Gunvarun Sudan, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 826 days.

(21) Appl. No.: 18/050,151

(22) Filed: Oct. 27, 2022

(65) Prior Publication Data

US 2024/0143890 A1    May 2, 2024

(51) Int. Cl.
*G06F 30/30*      (2020.01)
*G06F 30/333*     (2020.01)
*G06F 30/337*     (2020.01)
*G06F 30/347*     (2020.01)

(52) U.S. Cl.
CPC .......... *G06F 30/333* (2020.01); *G06F 30/337* (2020.01); *G06F 30/347* (2020.01)

(58) Field of Classification Search
None
See application file for complete search history.

(56) References Cited

U.S. PATENT DOCUMENTS

| | | | | |
|---|---|---|---|---|
| 6,052,808 A * | 4/2000 | Wu | ............... | G01R 31/318569 |
| | | | | 714/30 |
| 7,868,665 B2 * | 1/2011 | Tumer | ............... | H03F 3/45475 |
| | | | | 327/51 |
| 2004/0017224 A1* | 1/2004 | Tumer | ............... | H04N 25/773 |
| | | | | 327/51 |
| 2013/0044248 A1* | 2/2013 | Tumer | ............... | H03F 3/45475 |
| | | | | 348/E5.091 |

* cited by examiner

*Primary Examiner* — Leigh M Garbowski
(74) *Attorney, Agent, or Firm* — Xianghui Huang; Frank D. Cimino

(57)          ABSTRACT

A circuit includes: channel signal chains; configuration registers including a configuration register for each of the channel signal chains; channel data registers including a channel data register for each of the channel signal chains; a first communication interface coupled to the configuration registers via a daisy-chain connection; a second communication interface coupled to the set of channel data registers via respective parallel connections; and routing interfaces including a routing interface for each of the channel signal chains, each of the routing interfaces having a routing data input, a daisy-chain connection input, a parallel connection input, first and second control inputs, and a routing data output.

20 Claims, 8 Drawing Sheets

| GROUP | COL | 35 | 34 | 33 | 32 | 31 | 30 | 29 | 28 | 27 | ... | 6 | 5 | 4 | 3 | 2 | 1 | 0 |
|---|---|---|---|---|---|---|---|---|---|---|---|---|---|---|---|---|---|---|
| 11 | 23 | 828 | 829 | 830 | 831 | 832 | 833 | 834 | 835 | 836 | | 857 | 858 | 859 | 860 | 861 | 862 | 863 |
|    | 22 | 827 | 826 | 825 | 824 | 823 | 822 | 821 | 820 | 819 | | 798 | 797 | 796 | 795 | 794 | 793 | 792 |
| 10 | 21 | 756 | 757 | 758 | 759 | 760 | 761 | 762 | 763 | 764 | | 785 | 786 | 787 | 788 | 789 | 790 | 791 |
|    | 20 | 755 | 754 | 753 | 752 | 751 | 750 | 749 | 748 | 747 | | 726 | 725 | 724 | 723 | 722 | 721 | 720 |
| 9  | 19 | 684 | 685 | 686 | 687 | 688 | 689 | 690 | 691 | 692 | | 713 | 714 | 715 | 716 | 717 | 718 | 719 |
|    | 18 | 683 | 682 | 681 | 680 | 679 | 678 | 677 | 676 | 675 | | 654 | 653 | 652 | 651 | 650 | 649 | 648 |
| 8  | 17 | 612 | 613 | 614 | 615 | 616 | 617 | 618 | 619 | 620 | | 641 | 642 | 643 | 644 | 645 | 646 | 647 |
|    | 16 | 611 | 610 | 609 | 608 | 607 | 606 | 605 | 604 | 603 | | 582 | 581 | 580 | 579 | 578 | 577 | 576 |
| 7  | 15 | 540 | 541 | 542 | 543 | 544 | 545 | 546 | 547 | 548 | | 569 | 570 | 571 | 572 | 573 | 574 | 575 |
|    | 14 | 539 | 538 | 537 | 536 | 535 | 534 | 533 | 532 | 531 | | 510 | 509 | 508 | 507 | 506 | 505 | 504 |
| 6  | 13 | 468 | 469 | 470 | 471 | 472 | 473 | 474 | 475 | 476 | | 497 | 498 | 499 | 500 | 501 | 502 | 503 |
|    | 12 | 467 | 466 | 465 | 464 | 463 | 462 | 461 | 460 | 459 | | 438 | 437 | 436 | 435 | 434 | 433 | 432 |
| 5  | 11 | 396 | 397 | 398 | 399 | 400 | 401 | 402 | 403 | 404 | | 425 | 426 | 427 | 428 | 429 | 430 | 431 |
|    | 10 | 395 | 394 | 393 | 392 | 391 | 390 | 389 | 388 | 387 | | 366 | 365 | 364 | 363 | 362 | 361 | 360 |
| 4  | 9  | 324 | 325 | 326 | 327 | 328 | 329 | 330 | 331 | 332 | | 353 | 354 | 355 | 356 | 357 | 358 | 359 |
|    | 8  | 323 | 322 | 321 | 320 | 319 | 318 | 317 | 316 | 315 | | 294 | 293 | 292 | 291 | 290 | 289 | 288 |
| 3  | 7  | 252 | 253 | 254 | 255 | 256 | 257 | 258 | 259 | 260 | | 281 | 282 | 283 | 284 | 285 | 286 | 287 |
|    | 6  | 251 | 250 | 249 | 248 | 247 | 246 | 245 | 244 | 243 | | 222 | 221 | 220 | 219 | 218 | 217 | 216 |
| 2  | 5  | 180 | 181 | 182 | 183 | 184 | 185 | 186 | 187 | 188 | | 209 | 210 | 211 | 212 | 213 | 214 | 215 |
|    | 4  | 179 | 178 | 177 | 176 | 175 | 174 | 173 | 172 | 171 | | 150 | 149 | 148 | 147 | 146 | 145 | 144 |
| 1  | 3  | 108 | 109 | 110 | 111 | 112 | 113 | 114 | 115 | 116 | | 137 | 138 | 139 | 140 | 141 | 142 | 143 |
|    | 2  | 107 | 106 | 105 | 104 | 103 | 102 | 101 | 100 | 99 | | 78 | 77 | 76 | 75 | 74 | 73 | 72 |
| 0  | 1  | 36 | 37 | 38 | 39 | 40 | 41 | 42 | 43 | 44 | | 65 | 66 | 67 | 68 | 69 | 70 | 71 |
|    | 0  | 35 | 34 | 33 | 32 | 31 | 30 | 29 | 28 | 27 | | 6 | 5 | 4 | 3 | 2 | 1 | 0 |
| GROUP | ROW | | | | | | | | | | | | | | | | | |

DUT SPI INTERFACE
(SCLK,SDIN,SDOUT,SEN)

LVDS LANES

512

514

508

510

SPI CALIBRATION
CHAIN CONTROLLER

LVDS DATA READOUT
CONTROLLER

CALIBRATION CHAIN
DATA DURING
NORMAL MODE

504

511

CHANNEL DATA
DURING NORMAL MODE
OR CALIBRATION
CHAIN DATA DURING
TEST MODE

CHANNEL AND ROUTING INTERFACE ARRAY
502

700

702 — SERIALLY SHIFT CALIB
<79:0> ON LVDS DATA LANE

704 — FIND CHAIN AND CHANNEL
INFORMATION FOR STUCK
CHANNELS FROM DATA READOUT

706

NUMBER BAD
CHANNELS < LIMIT?

NO

FAIL DIE

YES

708 — BLOW FUSES TO BYPASS
"BAD CHANNELS"

710 — MASK APPROPRIATE
VECTORS IN SCAN PATTERN

712 — EXECUTE MODIFIED SCAN VECTORS

SCAN
PASSES?

NO

FAIL DIE

714     YES

716 — PASS DIE AND MOVE TO NEXT TEST

SMART SCAN OPTIONS TO IMPROVE WAFER DIE YIELD

BACKGROUND

Some integrated circuit (ICs) include an analog front-end with many channel (e.g., hundreds of channels). For example, imaging application ICs may include a channel signal chain for each position of a sensor array. With such ICs, there may be some budget for faulty channels (e.g., 0.5% may be faulty). Determining if a channel is faulty is not a trivial task. For example, the communication interfaces for such ICs may be daisy-chained, which prevents clarity with regard to which channel has a fault. In a conventional IC, faults in a single channel can render a whole chain of channels (e.g., up to 72 channels) unusable. Thus, the budget for faulty channels in an IC under test may be surpassed easily. Poor die yield as well as expensive redundancies are undesirable.

SUMMARY

In an example embodiment, a circuit comprises: channel signal chains; configuration registers including a configuration register for each of the channel signal chains; channel data registers including a channel data register for each of the channel signal chains; a first communication interface coupled to the configuration registers via a daisy-chain connection; a second communication interface coupled to the set of channel data registers via respective parallel connections; and routing interfaces including a routing interface for each of the channel signal chains. Each of the routing interfaces has a routing data input, a daisy-chain connection input, a parallel connection input, first and second control inputs, and a routing data output.

In another example embodiment, a method comprises: obtaining test mode data related to a channel signal chain of an integrated circuit; routing the test mode data from a daisy-chain connection of the channel signal chain to a parallel connection in response to a test mode control signal; identifying the channel signal chain as good or bad based on the routed test mode data; and bypassing a scan test of the channel signal chain if the channel signal chain is identified as bad.

BRIEF DESCRIPTION OF THE DRAWINGS

FIG. 2 is a table showing an integrated circuit (IC) channel map in accordance with an example embodiment.

DETAILED DESCRIPTION

Figure 1:
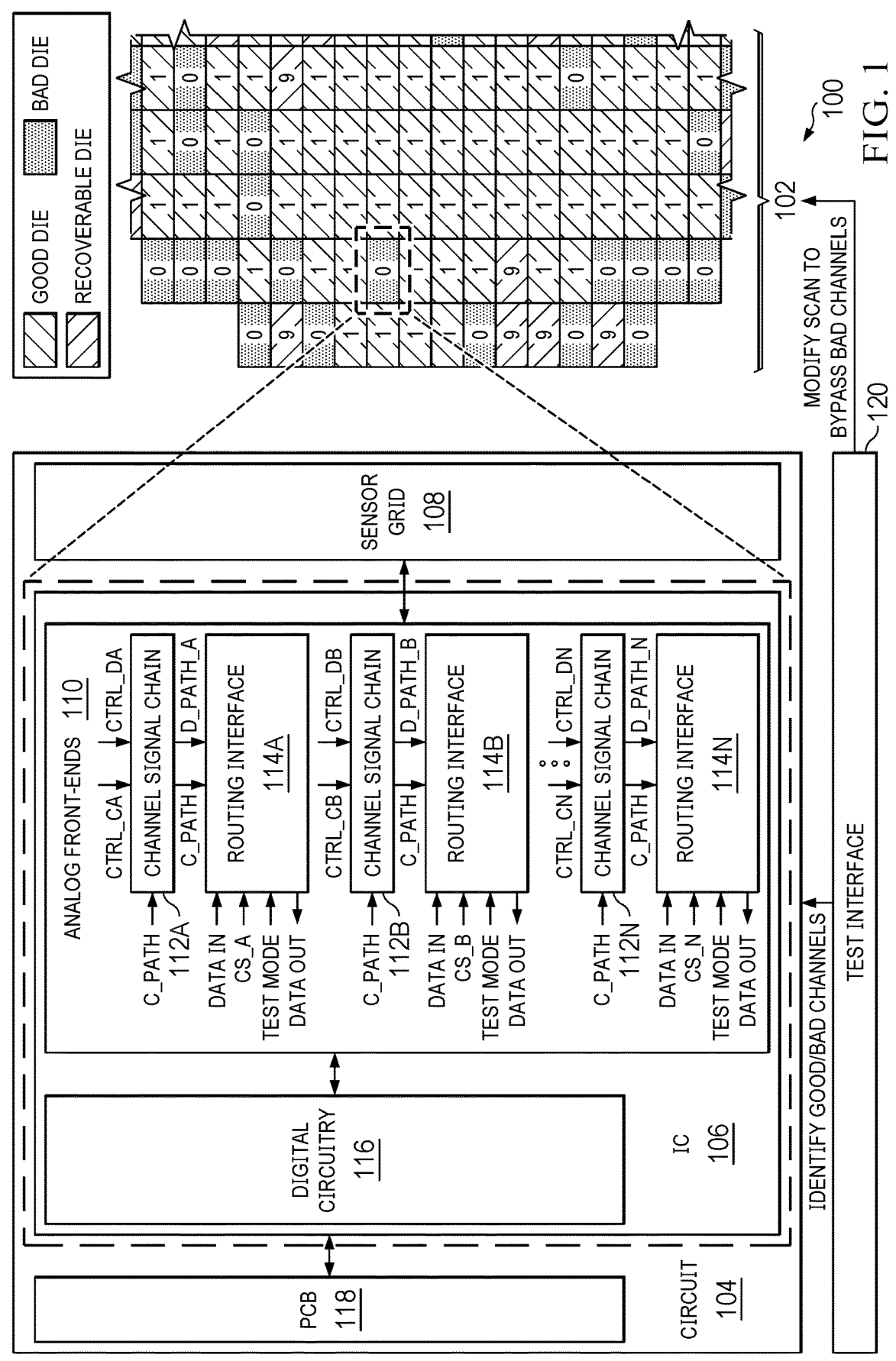
FIG. 1 is a block diagram showing a system in accordance with an example embodiment.

The same reference numbers or other reference designators are used in the drawings to designate the same or similar (either by function and/or structure) features.

The fabrication of ICs typically starts with a semiconductor wafer. Device structures (e.g., transistors, capacitors, resistors and/or inductors) are formed on/over the semiconductor wafer/substrate and interconnected using metallization structures formed over the substrate. Subsequently (e.g., after the wafers are probe tested, if probe testing is performed), the wafers are "diced" whereby individual ICs are singulated and packaged (e.g., in a semiconductor package). After packaging, the IC may be tested.

FIG. 1 is a block diagram showing a system 100 in accordance with an example embodiment. As shown, the system 100 includes a portion of a semiconductor wafer 102 and a test interface 120. The wafer 102 includes an array of dies or integrated circuits (ICs). An example IC of the wafer 102 is shown as IC 106 in FIG. 1. In the example of FIG. 1, the IC 106 is part of a larger circuit 104 (e.g., an imaging circuit that may be incorporated into a medical and/or industrial system, such as an x-ray, computerized tomography, ultrasound or magnetic resonance imaging system) that includes a printed circuit board (PCB) 118. For example, the IC 106 may be mounted to the PCB 118, which may include traces, pins, and/or other connectors that facilitate coupling the test interface 120 to the IC 106.

With the test interface 120, different test processes are performed (e.g., using probes to connect the test interface 120 with each of the ICs on wafer 120). One test performed by the test interface 120 individually identifies which channels of each IC are good (usable) and which channels of each IC are bad (not usable) based on the ability to write to or read from storage units for each respective channel. This test may be termed a communication and configurability test for each channel. Hereafter, all such tests to identify channels as good or bad are referred to herein as "test mode operations". If the test mode operations identify more than a threshold number or percentage of channels of a given IC as good, the entire IC is identified as good. Otherwise, if the test mode operations identify less than the threshold number or percentage of channels of a given IC as good, the entire IC is identified as bad. In different example embodiments, the test mode operations may vary depending on redundancy options included for each of the channel signal chains 112A, 112B-112N of the IC 106. Hereafter, channel signal chains may be referred to simply as "channels" herein. After the test mode operations are complete, scan operations may be performed based on the results of the test mode operations. For example, the scan operations may bypass channels identified as bad by the test mode operations and/or perform related bypass operations (e.g., padding scan data with null data based on location of bad channels, bypassing scan logic of each bad channel, gating clocks related to bad channels, and/or other bypass operations).

In some example embodiments, the test mode operations leverage the availability of different communication interfaces to access each of the channel signal chains. For example, each of the channel signal chains 112A-112N may include a configuration storage unit (e.g., configuration storage unit 330 in FIG. 3), where access to each configuration storage unit is available via a daisy-chained communication interface (labeled the "C_PATH" in FIG. 1, where the C_PATH refers to a daisy-chained communication interface to support configuration options). Each of the channel signal chains 112A-112N may also include a channel data storage unit (e.g., the channel data storage unit 326 in FIG. 3), where access to each channel data storage unit is via respective parallel communication interfaces (labeled "D_PATH_A" to "D_PATH_N" in FIG. 1, where each respective D_PATH refers to a parallel communication interface to support channel data readouts). In some example embodiments, the test mode operations involve routing the contents of each configuration storage unit to an available D_PATH. Different options for routing the contents of each configuration storage unit to an available D_PATH during test mode operations are possible. In the example of FIG. 1, such routing options are performed by the routing interfaces 114A, 114B-114N.

In some example embodiments, test mode operations are performed internally within a given IC. As another option, test mode operations may be performed using an external test interface. In either case, the results of the test mode operations are organized and stored for later use. For example, the results of the test mode operations may be used to compile a list of: good channels for each IC; bad channels for each IC; good ICs (e.g., those ICs with at least a threshold number or percentage of good channels); and/or bad ICs (those ICs with less than the threshold number or percentage of good channels). In some example embodiments, the results of the test mode operations may be used to blow fuses related to each bad channel or each bad IC. The compiled list may also be used by the test interface 120, for example, to prepare instructions for subsequent operations. In some example embodiments, the test interface 120 performs scan operations configured to verify the functionality of the hardware/logic of all ICs or IC channels identified as good based on the results of the test mode operations. In some example embodiments, the scan operations include: bypassing the scan logic of channel signal chains previously identified as bad based on the test mode results; padding output data with null data based on location of each channel signal chain to be bypassed; and gating clocks related to each channel signal chain to be bypassed.

In the example of FIG. 1, the IC 106 includes analog front-ends 110 coupled to a sensor grid 108 external to the IC 106. In some example embodiments, the sensor grid 108 includes distributed sensor materials configured to convert electromagnetic energy (e.g., X-ray photons) to an input charge ($Q_{IN}$). In some example embodiments, the sensor grid 108 may be included with the IC 106. In either case, the analog front-ends 110 include channel signal chains 112A-112N. Without limitation, each of the channel signal chains 112A-112N may be configured to: receive a respective charge ($Q_{IN}$) related to a portion of the sensor grid 108; adjust $Q_{IN}$ parameters; detect whether the adjusted $Q_{IN}$ triggers an event detection; and store an event detection count. Each of the channel signal chains 112A-112N additionally support configurability, data readouts, a daisy-chained communication option with one or more controllers, and a parallel communication option with one or more controllers.

In the example of FIG. 1, each of the channel signal chains 112A-112N has a C_PATH input, a first control input, a second control input, a C_PATH output, and a respective D_PATH output. In operation, each of the channel signal chains 112A-112N is configured to: perform configuration options via the C_PATH in response to control signals (e.g., CTRL_CA to CTRL_CN) received at each first control input; and perform channel data readouts via a respective D_PATH in response to control signals (e.g., CTRL_DA to CTRL_DN) received at each second control input. The C_PATH may be used, for example, to set, adjust, or calibrate configuration parameters for each of the channel signal chains 112A-112N. When relying only on the C_PATH to test a channel signal chain or related configuration storage units, it is not possible to identify individual channels as good or bad. Instead, channels groups (e.g., up to 72 channels) may be identified as good or bad depending on where the fault is located. Using the C_PATH to identify channel groups as good or bad may too often result in an entire channel fault budget being exceeded. Thus, in some example embodiments, the test mode operations using the routing interfaces 114A-114N to route the content of configuration storage units to available D_PATHs. In this manner, each of the channel signal chains 112A-112N can be as good or bad individually. In a conventional approach, configuration storage units only use the C_PATH for configuration options, while channel data storage units use a respective D_PATH for data readouts. In contrast, example embodiments route content from the configuration storage units via an available D_PATH during test mode operations. Different options for routing contents of the configuration storage units to the D_PATH during a test mode are possible.

In the example of FIG. 1, each of the routing interfaces 114A-114N is related to a respective channel signal chain (e.g., the test routing interface 114A relates to the channel signal chain 112A, the test routing interface 114B relates to the channel signal chain 112B, etc.). Also, each of the test routing interfaces 114A-114N is coupled to the C_PATH and a respective D_PATH. During test mode operations, contents of the C_PATH or related daisy-chained configuration storage units are routed to an available D_PATH responsive to a test mode control signal (TEST MODE) and possibly other control signals (e.g., CS_A to CS_N).

In some example embodiments, each of the routing interfaces 114A-114N has a routing data (DATA IN) input, a daisy-chain connection (e.g., C_PATH) input, a parallel connection (e.g., a respective D_PATH) input, first and second control inputs, and a routing data (DATA OUT) output. The first control input may receive, for example, a TEST MODE signal. The second control input may receive, for example, a respective control signal (e.g., CS_A to CS_N). In some example embodiments, each of the routing interfaces 114A-114N may include a routing controller configured to: receive a test mode signal; and shift data from a given configuration storage unit to a respective channel data storage unit in response to the test mode signal to route the contents of the configuration storage units to a respective D_PATH. In other example embodiments, each of the test routing interfaces 114A-114N may include a routing controller configured to: receive a test mode signal; and route contents of a configuration storage unit (or content on the C_PATH) to an available D_PATH using a respective multiplexer in response to the test mode signal. In either case, each of the routing interfaces 114A-114N may forward the routed contents from the routing controller or routing data received at routing data input based on a respective control signal (e.g., CS_A to CS_N). In this manner, each of the channel signal chains 112A-112N is able to be tested individually during test mode operations.

In FIG. 1, digital circuitry 116 is coupled to the analog front-ends 110 (e.g., via the C path or D path, and/or related communication controllers). The digital circuitry 116 may include a processor and/or other control logic to: direct operations related to the analog front-ends 110; perform test mode operations (e.g., communication and configurability test operations, scan operations, etc.); send data to the analog front-ends 110; receive data from the analog front-ends 110; store test results; and/or other operations. In some example embodiments, the digital circuitry 116 includes: a first controller configured to manage channel signal chain calibration operations; and a second controller configured to manage channel data readouts from each channel signal chain. The first controller may be, for example, a serial peripheral interface (SPI) controller. The second controller may be, for example, a low-voltage differential signaling (LVDS) controller. As needed, the first controller may communicate with the second controller and vice versa. As another option, the first controller and the second controller may write to and read from the same storage unit.

In FIG. 1, the wafer 102 includes three types of dies indicating the improvement of die yield of the wafer 102 using the test mode operations described herein relative to a conventional approach. The first type of dies of the wafer 102 are good dies. The second type of dies of the wafer 102 are bad dies. The third type of dies of the wafer 102 are recoverable dies. The recoverable dies of the wafer 102 refer to dies that would fail in a conventional approach due to daisy-chained operations, but that are identifiable as good dies based on the test mode operations described herein.

FIG. 2 is a table showing an IC channel map 200 in accordance with an example embodiment. In the example IC channel map 200 of FIG. 2, there are 36 columns, 24 rows, and 12 channel groups (e.g., each channel of FIG. 2 corresponding to one of the channel signal chains 112A-112N in FIG. 1), where each of the channel groups has 72 daisy-chained channels. For channel group 0, arrow 202 shows the direction in which daisy-chained data is routed (from channel 0 to channel 71). Conventionally, a fault in any of the channels in a channel group results in subsequent channels in the channel group being unusable. For example, channel group 0 includes channels 0 to 71, where channel 71 is the first channel of channel group 0 and channel 0 is the last channel of channel group 0. Conventionally, if channel 71 is faulty, the entire channel group 0 (e.g., channels 0-71) would be unusable. Also, if channel 5 is faulty, part of the channel group 0 (e.g., channels 0-5) would be unusable in a conventional approach. In contrast, with the described test mode operations, channel contents are routed individually via an available parallel communication interface such that each channel can be tested individually rather than as a group. After identification of each individual channel as good or bad, a list of good or bad channels may be compiled for later use (e.g., to perform scan operations for each good channel and bypass scan operations for each bad channel). As needed, an IC may be identified as good or bad (e.g., depending on the number or percentage of good channels relative to the number or percentage of bad channels). In such case, all channels of the IC may be bypassed for during scan operations.

Figure 3:
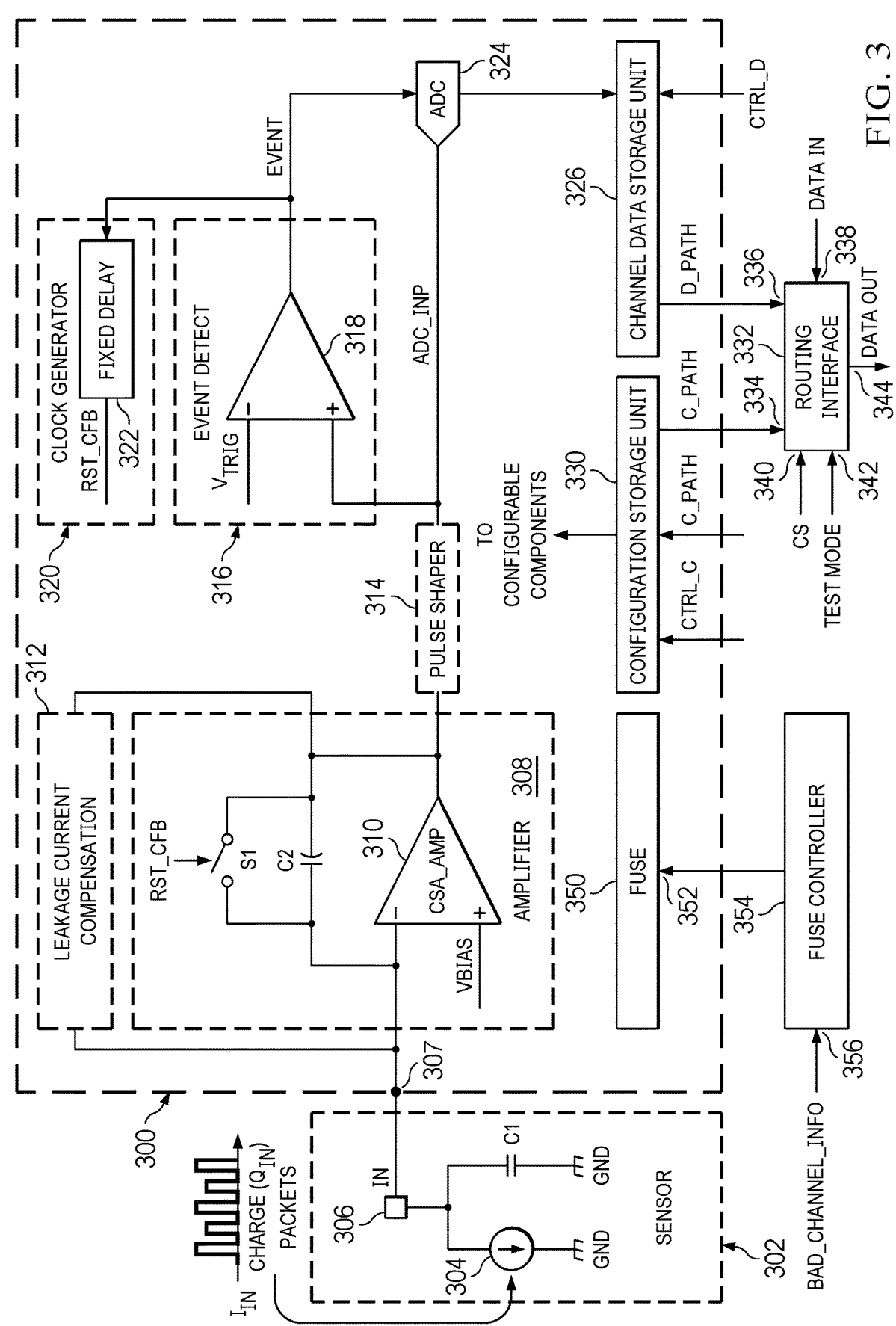
FIG. 3 is a schematic diagram showing a channel signal chain in accordance with an example embodiment.

FIG. 3 is a diagram showing a channel signal chain 300 (e.g., one of the channel signal chains 112A-112N in FIG. 1, or one of the channels in FIG. 2) in accordance with an example embodiment. As shown, the channel signal chain 300 is coupled to a sensor 302 (which may be a sensor in sensor grid 108), which is represented as a current source 304 and capacitor (C1) coupled in parallel to a sensor output 306. Over time, the sensor 302 accumulates charge at the sensor output 306 (e.g., the charge corresponding to received $Q_{IN}$ packets) based on sensing activities.

As shown, the channel signal chain 300 includes an input 307 coupled to the sensor output 306. The channel signal chain 300 also includes an amplifier circuit 308 and a leakage current compensation circuit 312 coupled to the input 307. In the example of FIG. 3, the amplifier circuit 308 includes an operational amplifier 310 having an inverting ("−") input, a non-inverting ("+") input, and an output. The inverting input of the operational amplifier 310 is coupled to the input 307 of the channel signal chain 300. The non-inverting ("+") input of the operational amplifier 310 is configured to receive a bias voltage (VBIAS). The output of the operational amplifier 310 is coupled to a pulse shaper circuit 314, the leakage current compensation circuit 312, and a feedback loop. In the example of FIG. 3, the feedback loop includes a capacitor (C2) and a switch (S1) in parallel between the output of the operational amplifier 310 and the inverting ("−") input of the operational amplifier 310. S1 is controlled by a control signal (RST_CFB), which selectively discharges C2 to reset the voltage stored by C2.

The output of the pulse shaper circuit 314 is provided to an event detect circuit 316 and an analog-to-digital converter (ADC) 324. In some example embodiments, the event detect circuit 316 includes a comparator 318 having a non-inverting ("+") input, an inverting ("−") input, and an output. The non-inverting ("+") input of the comparator 318 is coupled to the output of the pulse shaper circuit 314. The inverting ("−") input of the comparator 318 is configured to receive an event trigger threshold voltage ($V_{TRIG}$). The output of the comparator 318 is coupled to a clock generator circuit 320 and a control input of the ADC 324. When an event is detected, the event detect circuit 316 provides an event detected signal (labeled EVENT in FIG. 3) to the clock generator circuit 320 and the ADC 324. In response to the event detected signal, the clock generator circuit 320 asserts RST_CFB after a delay. The delay is provided, for example, by a fixed delay circuit 322 of the clock generator circuit 320. In some example embodiments, the amount of delay is controlled digitally using channel-level configuration registers and may be based on a target count-rate performance.

The ADC 324 is configured to: receive an input signal (ADC_INP, where ADC_INP is the output of the pulse shaper circuit 314); and provide a digital value based on ADC_INP in response to the event detected signal. The output of the ADC 324 is coupled to a channel data storage unit 326 (e.g., a counter), which tracks the number of events detected. In response to a first control signal (labeled CTRL_D, where CTRL_D is an example of CTRL_DA, CTRL_DB, etc.), the contents of the channel data storage unit 326 are provided to a routing interface 332 (an example of one of the routing interfaces 114A-114N) via a respective D_PATH. In some example embodiments, CTRL_D is periodically asserted (e.g., every 50 us to 1 ms) during normal operations. After every readout, the channel data storage unit 326 may be reset. With the channel signal chain 300, various parameters are configurable. Example parameters of the channel signal chain 300 that are adjustable include: the bandwidth of the operational amplifier 310, the amount of leakage current compensation provided by the leakage current compensation circuit 312; the pulse shape controlled by the pulse shaper circuit 314; the event trigger threshold ($V_{TRIG}$); energy discrimination thresholds and/or other parameters.

To support configuration options, the channel signal chain 300 includes a configuration storage unit 330. The configuration storage unit 330 may store configuration instructions and/or related parameters for use with configurable options of the channel signal chain 300. In some example embodiments, writes to and reads from the configuration storage unit 330 are performed via the C_PATH responsive to a second control signal (CTRL_C, where CTRL_C is an example of CTRL_CA, CTRL_CB, etc.) during normal operations. For example, the routing interface 332 may pass C_PATH data to and from the configuration storage unit 330 as needed during normal operations (e.g., DATA OUT from the routing interface 332 may route configuration data as C_PATH data during normal operations). Once configuration parameters are determined and stored by the configuration storage unit 330, the configuration parameters may be provided to configurable components of the channel signal chain 300 as desired.

During test mode operations, C_PATH data or contents of the configuration storage unit 330 may be routed to the D_PATH. For example, the routing interface 332 may route C_PATH data or the contents of the configuration storage unit 330 to a respective D_PATH in response to test mode control signals (e.g., DATA OUT from the routing interface 332 may be C_PATH data or the contents of the configuration storage unit 330 routed as D_PATH data during a test mode scenario).

In some example embodiments, the routing interface 332 has a daisy-chain connection input 334, a parallel connection input 336, a routing data input 338, a first control input 340, a second control input 342, and a routing data output 344. The routing interface 332 includes a routing controller (e.g., routing controller 411, routing controller 413, or routing controller 415 in FIG. 4) configured to route data received at the daisy-chain connection input 334 or data received at the parallel connection input 336 in response to TEST MODE received at the second control input 342. In some example embodiments, the routing controller includes a data shifting interface configured to shift data between the configuration storage unit 330 and the channel data storage unit 326 in response to the routing interface 332 receiving TEST MODE at the second control input 342. In other example embodiments, the routing controller includes a multiplexer interface configured to route contents of the configuration storage unit 330 to an available parallel connection in response to the routing interface 332 receiving TEST MODE at the second control input 342.

Figure 4:
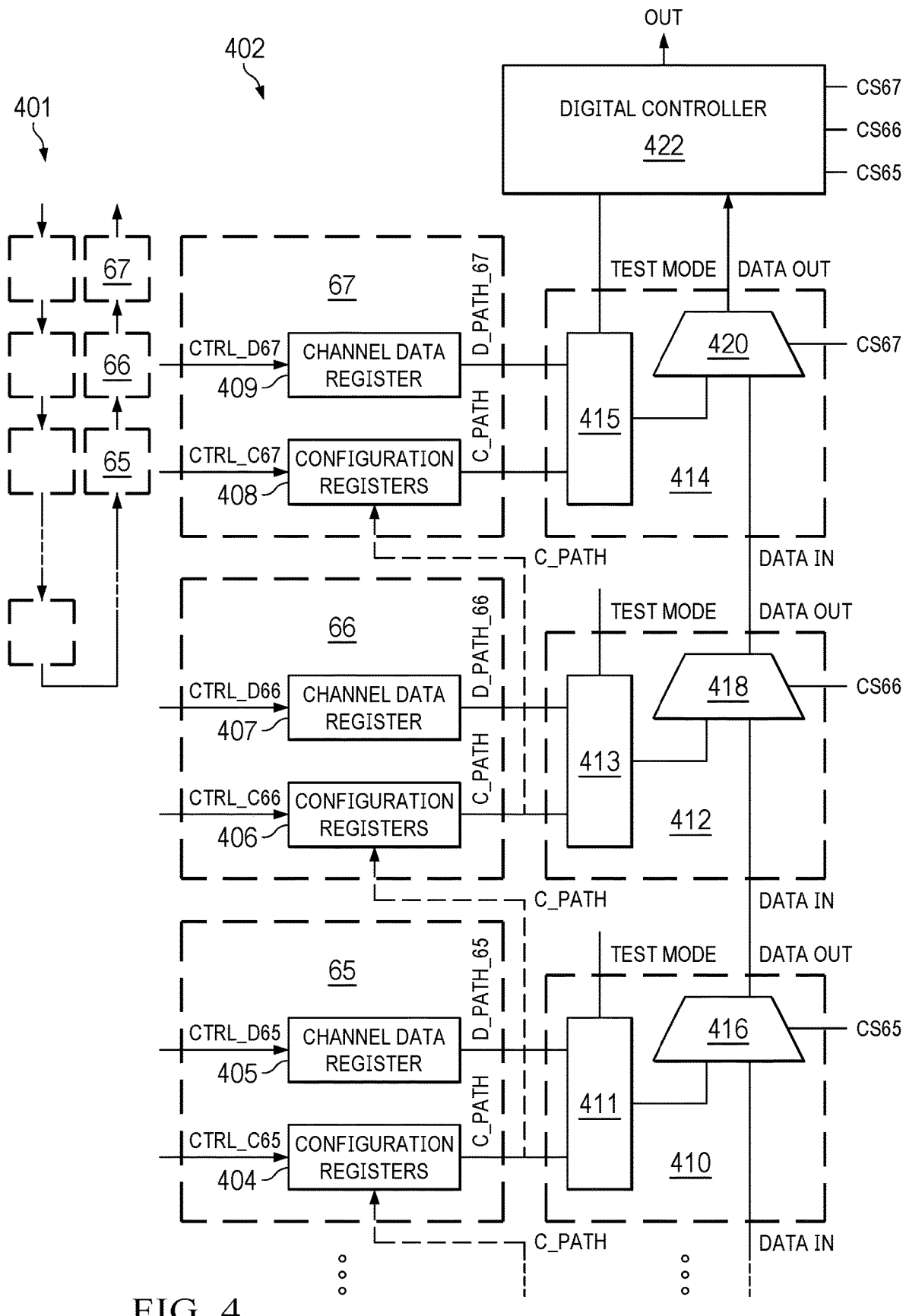
FIG. 4 is a schematic diagram showing a channel group and a related communication interface arrangement in accordance with an example embodiment.

In some example embodiments, the routing interface 332 includes a multiplexer (e.g., multiplexer 416, multiplexer 418, or multiplexer 420 in FIG. 4) having a control input, a multiplexer output and first and second multiplexer inputs. The first multiplexer input is coupled to the routing controller output. The second multiplexer input is coupled to the routing data input 338. The control input is coupled to the first control input 340. The multiplexer output is coupled to the routing data output 344. In operation, the routing interface 332 is configured to forward the output from the routing controller or the routing data at routing data input 338 in response to the routing interface 332 receiving a control signal (e.g., CS, where CS is an example of CS_A, CS_B, etc.) at the first control input 340.

FIG. 4 is a diagram showing a channel group 401 and a related communication interface arrangement 402 in accordance with an example embodiment. In FIG. 4, the channel group 401 includes 72 channels (e.g., channels 0-71 of channel group 0 in FIG. 2). The related communication interface arrangement 402 includes channel data registers and configuration registers for each channel, routing interfaces for each channel, and a digital controller 422. In the example of FIG. 4, example components of some of the channels (e.g., channels 65, 66, and 67) and related routing interfaces (e.g., routing interfaces 410, 412, and 414) are shown.

For example, channel 65 includes configuration registers 404 (an example of the configuration storage unit 330 in FIG. 3), a channel data register 405 (an example of the channel data storage unit 326 in FIG. 3), and a routing interface 410 (an example of one of the routing interfaces 114A-114N in FIG. 1, or the routing interface 332 in FIG. 3). In the example of FIG. 4, the routing interface 410 is controlled by TEST MODE and a channel 65 control signal (CS65). In the example of FIG. 4, CS65 is provided by the digital controller 422, which may be part of the test interface 120 of FIG. 1 and/or one of the other controllers (e.g., the controllers 508 and 510 in FIG. 5) described herein. In some example embodiments, the routing interface 410 includes a routing controller 411 and a multiplexer 416. The routing controller 411 is coupled to the C_PATH and D_PATH_65 (the D_PATH for channel 65). When TEST MODE is asserted, the routing controller 411 routes C_PATH data or content from the configuration registers 404 to a first multiplexer input of the multiplexer 416. When TEST MODE is not asserted, the routing controller 411 routes D_PATH_65 data or content from the channel data register 405 to the first multiplexer input of the multiplexer 416. The second multiplexer input of the multiplexer 416 is coupled to the routing data input of the routing controller 411 to receive DATA IN. As shown, DATA IN for channel 65 corresponds to DATA OUT of the previous channel (e.g., channel 64). The multiplexer output of the multiplexer 416 is coupled to a routing data output of the routing controller 411 to provide DATA OUT. By controlling TEST MODE for the routing controller 411 and CS65 for the multiplexer 416, DATA OUT from the routing interface 410 may be channel data during normal operations, or configuration test data during test mode operations.

As shown, channel 66 includes configuration registers 406 (an example of the configuration storage unit 330 in FIG. 3), a channel data register 407 (an example of the channel data storage unit 326 in FIG. 3), and a routing interface 412 (an example of one of the routing interfaces 114A-114N in FIG. 1, or the routing interface 332 in FIG. 3). In the example of FIG. 4, the routing interface 412 is controlled by TEST MODE and a channel 66 control signal (CS66). In the example of FIG. 4, CS66 is provided by the digital controller 422, which may be part of the test interface 120 of FIG. 1 and/or one of the other controllers (e.g., the controllers 508 and 510 in FIG. 5) described herein. In some example embodiments, the routing interface 412 includes a routing controller 413 and a multiplexer 418. The routing controller 413 is coupled to the C_PATH and D_PATH_66 (the D_PATH for channel 66). When TEST MODE is asserted, the routing controller 413 routes C_PATH data or content from the configuration registers 406 to a first multiplexer input of the multiplexer 418. When TEST MODE is not asserted, the routing controller 413 routes D_PATH_66 data or content from the channel data register 407 to the first multiplexer input of the multiplexer 418. The second multiplexer input of the multiplexer 418 is coupled to the routing data input of the routing interface 412 to receive DATA IN. As shown, DATA IN for channel 66 corresponds to DATA OUT of the previous channel (e.g., channel 65). The multiplexer output of the multiplexer 418 is coupled to a routing data output of the routing interface 412 to provide DATA OUT. By controlling TEST MODE for the routing controller 413 and CS66 for the multiplexer 418, DATA OUT from the routing interface 412 may be channel data during normal operations, or configuration test data during test mode operations.

As shown, channel 67 includes configuration registers 408 (an example of the configuration storage unit 330 in FIG. 3), a channel data register 409 (an example of the channel data storage unit 326 in FIG. 3), and a routing interface 414 (an example of one of the routing interfaces 114A-114N in FIG. 1, or the routing interface 332 in FIG. 3). In the example of FIG. 4, the routing interface 414 is controlled by TEST MODE and a channel 67 control signal (CS67). In the example of FIG. 4, CS67 is provided by the digital controller 422, which may be part of the test interface 120 of FIG. 1 and/or one of the other controllers (e.g., the controllers 508 and 510 in FIG. 5) described herein. In some example embodiments, the routing interface 414 includes a routing controller 415 and a multiplexer 420. The routing controller 415 is coupled to the C_PATH and D_PATH_67 (the D_PATH for channel 67). When TEST MODE is asserted, the routing controller 415 routes C_PATH data or content from the configuration registers 408 to a first multiplexer input of the multiplexer 420. When TEST MODE is not asserted, the routing controller 415 routes D_PATH_67 data or content from the channel data register 409 to the first multiplexer input of the multiplexer 420. The second multiplexer input of the multiplexer 420 is coupled to the routing data input of the routing interface 412 to receive DATA IN. As shown, DATA IN for channel 67 corresponds to DATA OUT of the previous channel (e.g., channel 66). The multiplexer output of the multiplexer 420 is coupled to a routing data output of the routing interface 414 to provide DATA OUT. By controlling TEST MODE for the routing controller 415 and CS67 for the multiplexer 420, DATA OUT from the routing interface 414 may be channel data during normal operations, or configuration test data during test mode operations. In addition to the parallel communication interface options provided via the routing interfaces 410, 412, and 414, the configuration registers 404, 406 and 408 are also coupled along the C_PATH, which may still be used during normal operations. For test mode operations, read outs from the configuration registers 404, 406, and 408 are routable by each respective routing controller 411, 413, 415 to an available parallel communication interface (D_PATH) options corresponding to the first multiplexer input of multiplexers 416, 418, and 420 in FIG. 4.

Figure 5:
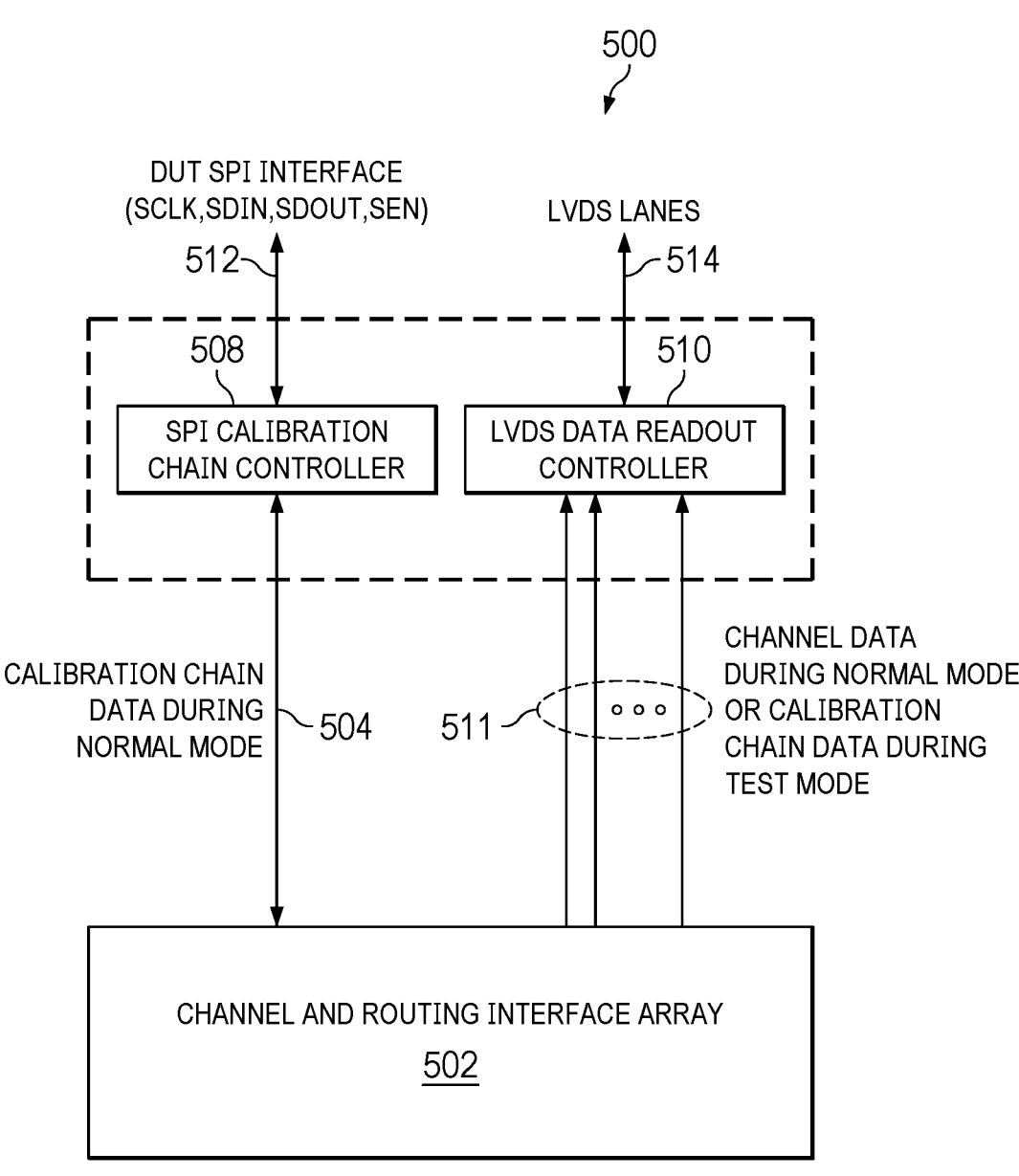
FIG. 5 is a block diagram showing an IC in accordance with an example embodiment.

FIG. 5 is a diagram showing an IC 500 in accordance with an example embodiment. In FIG. 5, the IC 500 includes a channel and routing interface array 502. The channel and routing interface array 502 includes, for example, channel signals chains (e.g., the channels signal chains 112A-112N in FIG. 1, the channels in FIG. 2, the channel signal chain 300 in FIG. 3, or the example channels in FIG. 4) as well as related routing interfaces (e.g., the routing interfaces 114A-114N in FIG. 1, the routing interface 332 in FIG. 3, or the routing interfaces 410, 412, and 414 in FIG. 4). In operation, the channel and routing interface array 502 supports C_PATH to D_PATH routing during test mode operations to enable individual channel testing as described herein. As shown, the channel and routing interface array 502 is in communication with an SPI calibration chain controller 508 via a daisy-chained communication interface or C_PATH 504. The C_PATH 504 is used, for example, to transfer calibration chain data (e.g., the content of the configuration storage units herein) between the SPI calibration chain controller 508 and channels of the channel and routing interface array 502 during normal mode operations. The channel and routing interface array 502 is also in communication with an LVDS data readout controller 510 via parallel communication interfaces or D_PATHS 511. The D_PATHS 511 are used, for example, to transfer channel data during normal operations. With the routing interfaces and appropriate control signals (e.g., TEST MODE, CS65, CS66, CS67, etc.), the D_PATHS 511 may also be used to transfer calibration chain data during test mode operations. By using the D_PATHS 511 to transfer calibration chain data during test mode operations, each channel of the channel and routing interface array 502 is able to be tested individually and identify as good or bad as described herein.

In the example of FIG. 5, the SPI calibration chain controller 508 is coupled to a device under test (DUT) SPI interface 512. Example signals of the DUT SPI interface include an SPI clock signal (SCLK), SPI data-in signal (SDIN), an SPI data-out signal (SDOUT), and an SPI enable signal (SEN). Also, the LVDS data readout controller 510 is coupled to LVDS lanes 514. The LVDS lanes 514 enable the LVDS data readout controller 510 to communicate with a field-programmable gate array (FPGA) or other controller configured to store, transfer, or interpret sensor data, and/or provide related control signals based on the sensor data. Once channels of the channel and routing interface array 502 are identified as good or bad, scan operations may be performed for the good channels. Meanwhile, the scan operations may bypass the bad channels.

Figure 6:
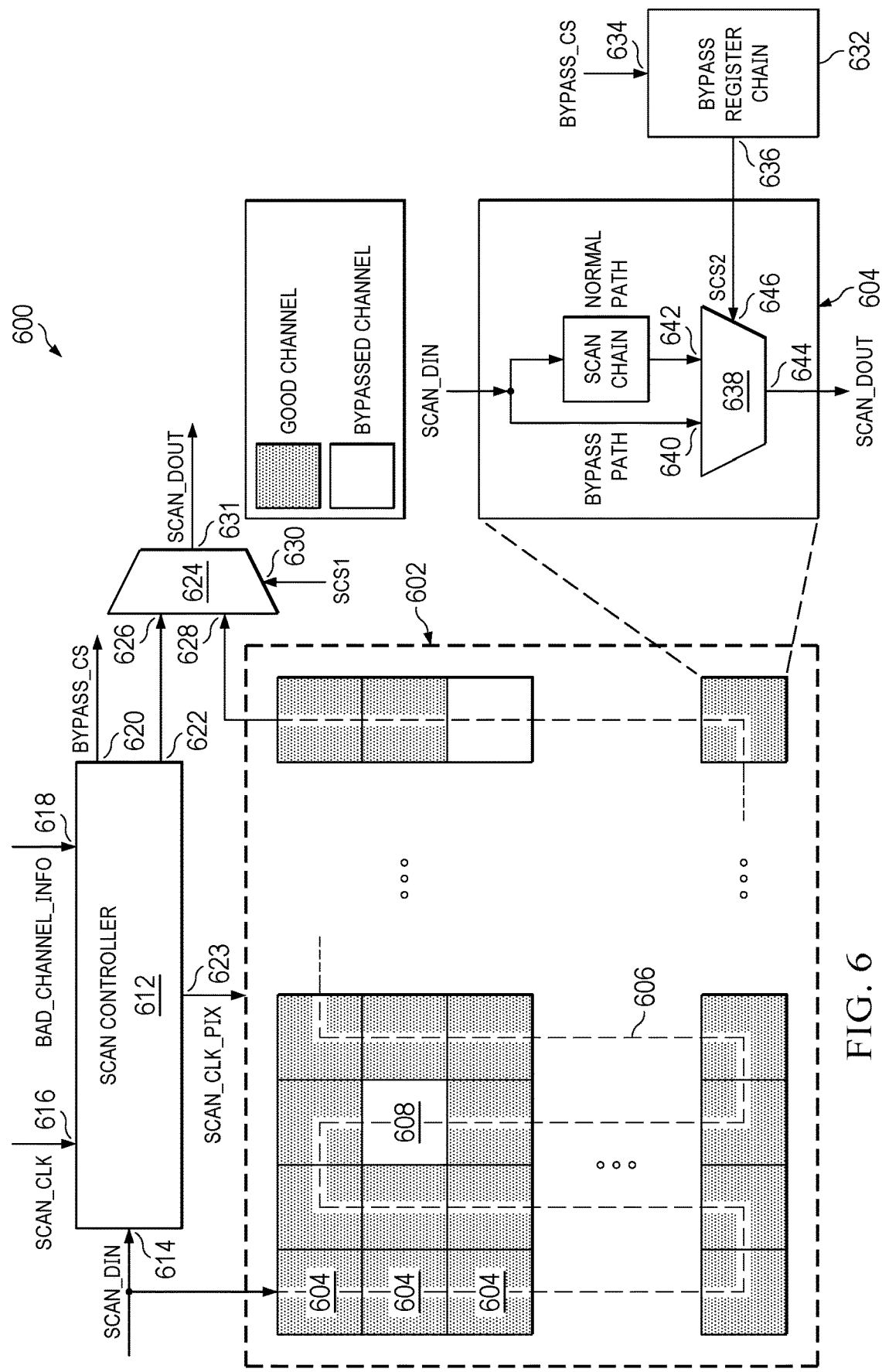
FIG. 6 is a block diagram showing an IC scan arrangement in accordance with an example embodiment.

FIG. 6 is a diagram showing an IC scan arrangement 600 in accordance with an example embodiment. As shown, the IC scan arrangement 600 includes an IC 602 (an example of the IC 106 in FIG. 1, or the IC 500 in FIG. 5) having a channel array 606. In the example of FIG. 6, each channel of the channel array 606 includes a scan chain (normal) path, a bypass path, and a scan path multiplexer 638. Specifically, each scan path multiplexer 638 includes a first multiplexer input 640, a second multiplexer input 642, a multiplexer output 644, and a control input 646. Each first multiplexer input 640 is coupled to a respective bypass path. Each second multiplexer input 642 is coupled to a respective scan chain path. Each control input 646 is configured to receive a control signal (SCS2). In operation, each multiplexer output 644 of each scan path multiplexer 638 is configured to provide output scan data (SCAN_DOUT) for a respective channel based on input scan data (SCAN_DIN) and the path (the bypass path or scan chain path) selected by SCS2. In some example embodiments, SCS2 is provided by a bypass register chain 632 having a control input 634 and a bypass control output 636.

In the example of FIG. 6, the scan controller 612 has a scan data input 614, a scan clock input 616, a control input 618, a bypass control output 620, a scan data output 622, and a scan clock output 623. In operation, the scan controller 612 is configured to gate the scan clock for each respective channel based on bad channel indications (BAD_CHANNEL_INFO) received at the control input 618. The scan controller 612 is also configured to provide a bypass control signal (BYPASS_CS) at the bypass control output 620 based on the bad channel indications received at the control input 618. In the example of FIG. 6, the bypass control output 620 is coupled to the bypass control input 634 of the bypass register chain 632.

In some example embodiments, the scan controller 612 may also be configured to provide output scan data (SCAN_DOUT) from the scan data output 622 during a self-test. To coordinate self-test operations of the scan controller 612, the IC scan arrangement 600 includes a multiplexer 624 having a first multiplexer input 626, a second multiplexer input 628, a control input 630, and a multiplexer output 631. The first multiplexer input 626 is coupled to the scan data output 622. The second multiplexer input 628 is coupled to the channel array. The control input 630 is configured to receive a control signal (SCS1) from the test interface (e.g., the test interface 120 in FIG. 1) managing the scan test. In one example embodiment, SCS1 is provided by a programmable SPI register. The multiplexer output 631 is coupled to the test interface managing the scan test and provides SCAN_DOUT from the channel array being tested or the scan controller 612 (if tested).

In the example of FIG. 6, individual channels of the channel array 606 are identified as good channels 604 and bypassed (bad) channels 608. To scan the channel array 606, the scan controller 612 accounts for the bad channels 608 by bypassing these channels and stitching scan operations for the remaining good channels together. In some example embodiments, both the scan controller 612 and the channel array 606 are part of one IC. For any IC to be marked/ declared good, the scan controller 612 needs to be fully fault free or in other words needs to pass scan tests. Once this is ascertained, the channel array (could hold few bad channels) is subject to scan tests. If the scan controller 612 is subject to a scan test, then the output of the scan controller 612 may be provided as the scan output data (SCAN_DOUT) of the IC. If the channel array 606 is subject to a scan test, the output of channel array 606 may be provided as the SCAN_DOUT via the multiplexer 624.

In some example embodiments, the scan clock signal (SCAN_CLK) and the scan input data (SCAN_DIN) are generated from a test interface (e.g., the test interface 120 of FIG. 1). SCAN_DOUT may also be monitored using the same test interface. If a channel is previously identified as bad based on the test mode operations, then it will be bypassed for scan operations. If bypassed, then the channel input will be directly connected to the channel output via the multiplexer 610. If not bypassed, the scan input will go through the scan chain within the channel and will be output via the multiplexer 610.

Figure 7:
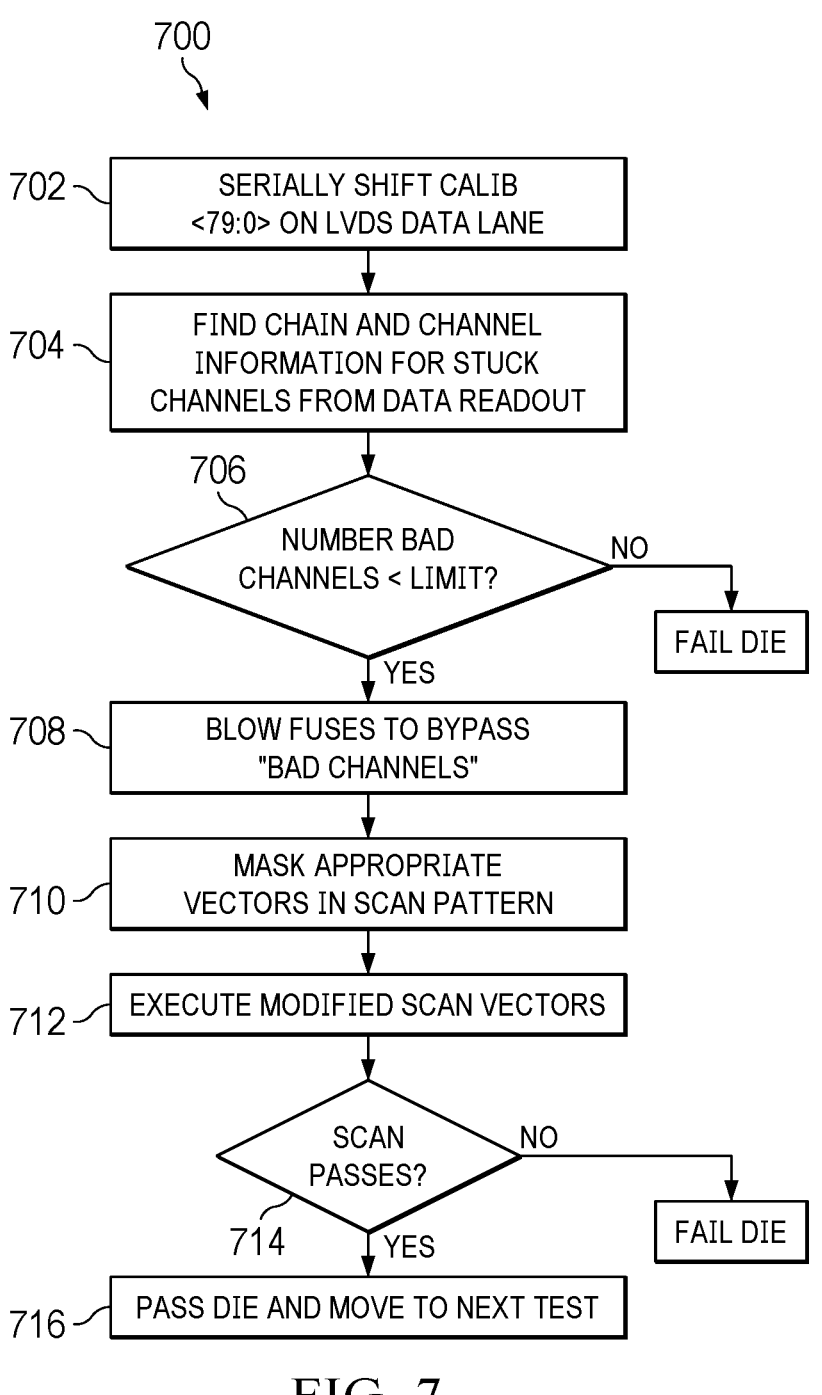
FIG. 7 is a flowchart showing an IC scan method in accordance with an example embodiment.

FIG. 7 is a flowchart showing an IC scan method 700 in accordance with an example embodiment. As shown, the IC scan method 700 includes a serial shift on the LVDS data lane at block 702. In some example embodiments, the serial shift involves serially shifting a known data pattern stored in the configuration storage unit of each channel to LVDS data lanes based on TEST MODE. This data is read out via the parallel LVDS interface. At block 704, chain and channel information are found for faulty channels based on the data readout of block 702. A die is identified as a failed die if the number (or percentage) of bad channels exceeds a threshold limit (determination block 706). If the number of bad channels (or percentage) does not exceed the threshold limit (determination block 706), fuses of the die are blown to bypass bad channels at block 708.

At block 710, appropriate vectors are masked in the scan pattern. Regarding block 710, each channel may have a set of scan flops through which input data is inserted. This input data is then shifted serially based on a clock signal, and eventually read out as output data. Using external test equipment, such as automated test equipment (ATE), scan outputs are compared with expected data to determine a pass/fail status. Regarding the vector masking operations of block 710, each of the scan flops corresponds to a single vector in the scan pattern used for testing (e.g., by an ATE). For example, if each channel has k flops, the total number of vectors in the scan pattern will be k*N, where N is the total number of channels (there will by N blocks of k vectors). The vectors are arranged successively in the scan pattern with vector block corresponding to the last channel (e.g., channel 864 in the example of FIG. 2) coming first followed by the next channel (e.g., channel 863 in FIG. 2) and so on until the last channel (e.g., channel 0 in FIG. 2). Once the fuses for the bad channels are blown, scan data for these channels will be padded with trivial or null data and is expected to fail. Based on the faulty channel information determined at block 704, the block of k vectors that need to be masked in the scan pattern is determined to ensure scan data compares are only executed on the good channels.

At block 712, the modified scan vectors (with masking added as needed) are executed. If the scan passes (determination block 714), the die passes and the method 700 proceeds to the next die to be tested. If the scan does not pass (determination block 714), the die fails and the method 700 proceeds to the next die to be tested. The method 700 may be repeated until all dies of a wafer have been tested.

Figure 8:
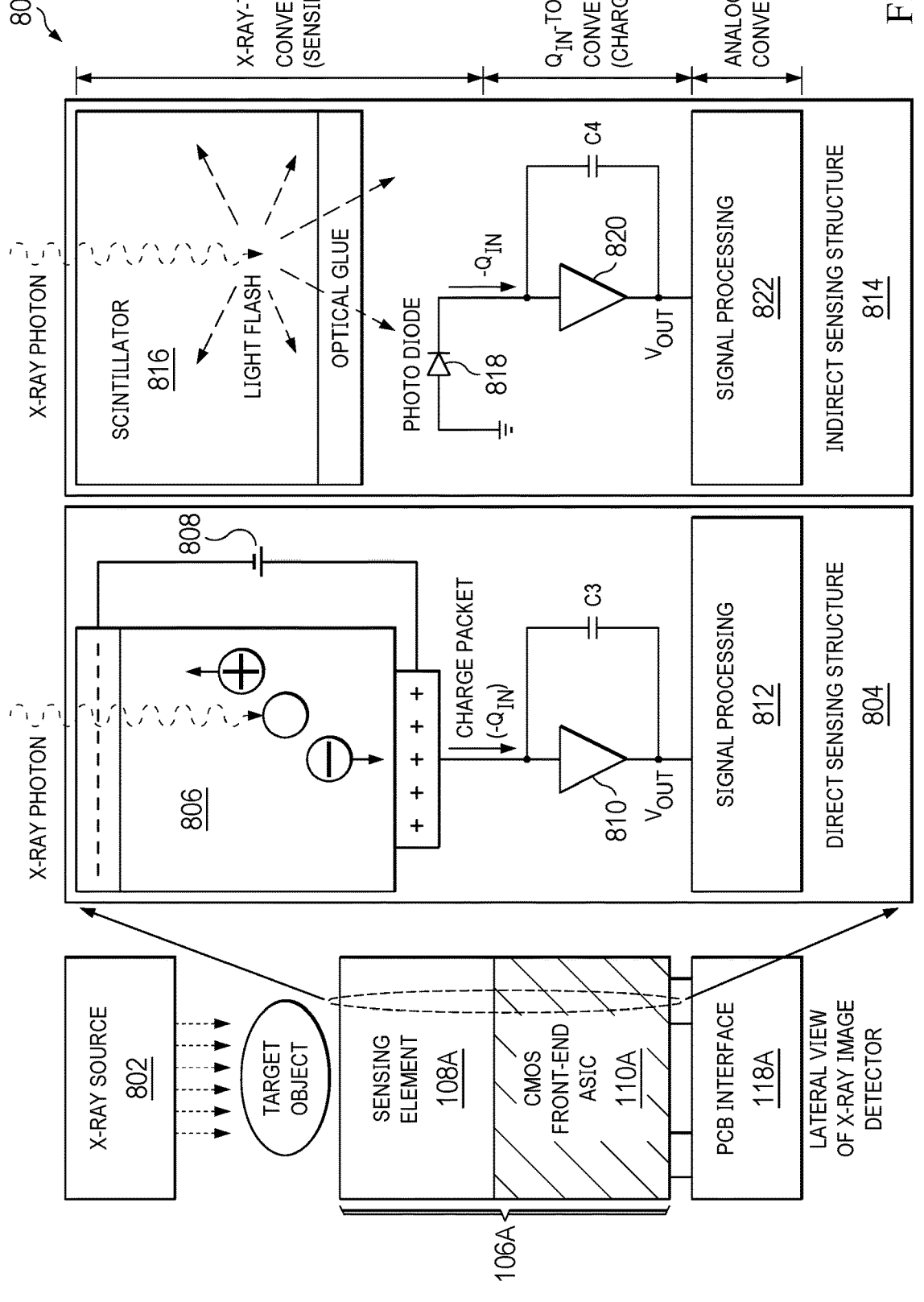
FIG. 8 is a diagram showing photon sensing system in accordance with an example embodiment.

FIG. 8 is a diagram showing a photon sensing system 800 in accordance with an example embodiment. In the example of FIG. 8, the photon sensing system 800 includes an X-ray source 802 configured to emit X-rays. The photon sensing system 800 also includes an IC 106A (an example of the IC 106 in FIG. 1) having a sensing element 108A (an example of the sensor grid 108 in FIG. 1) and a complementary metal-oxide semiconductor (CMOS) front-end application-specific IC (ASIC) 110A (an example of the analog front-end 110 in FIG. 1). In the example of FIG. 8, the IC 106A is mounted on a PCB 118A (an example of the PCB 118 in FIG. 1).

In some example embodiments, the photon sensing system 800 includes a direct sensing structure 804 having a photoconductor sensing element 806 configured to provide a charge ($Q_{IN}$) in response to X-ray photons. The photoconductor sensing element 806 is represented as equivalent to a battery 808 that provides $Q_{IN}$ in presence of X-ray photons. As shown, $Q_{IN}$ from the photoconductor sensing element 806 is amplified via an amplifier 810 having a feedback loop with a capacitor (C3). The output of the amplifier 810 is further processed by signal processing circuit 812 (e.g., part of the channel signal chain 300 in FIG. 3) to detect X-ray events of sufficient intensity.

In some example embodiments, the photon sensing system 800 includes an indirect sensing structure 814 having a scintillator element 816 configured to provide a charge ($Q_{IN}$) in response to X-ray photons. The scintillator element 816 is represented as equivalent to a photodiode 818 that provides $Q_{IN}$ in presence of X-ray photons. As shown, $Q_{IN}$ from the scintillator element 816 is amplified via an amplifier 820 having a feedback loop with a capacitor (C4). The output of the amplifier 820 is further processed by signal processing circuit 822 (e.g., part of the channel signal chain 300 in FIG. 3) to detect X-ray events of sufficient intensity. With individual channel testing and related smart scan options described herein, the yield of ICs (e.g., the IC 106 in FIG. 1, the IC 500 in FIG. 5, the IC 106A or the CMOS front-end ASIC 110A in FIG. 8) related to signal processing 812 or signal processing 822 is increased relative to a conventional approach.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Also, in this description, the recitation "based on" means "based at least in part on." Therefore, if X is based on Y, then X may be a function of Y and any number of other factors.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter.

Modifications are possible in the described embodiments, and other embodiments are possible, within the scope of the claims.

What is claimed is:

1. A circuit, comprising:
channel signal chains;

configuration registers including a configuration register for each of the channel signal chains;
channel data registers including a channel data register for each of the channel signal chains;
a first communication interface coupled to the configuration registers via a daisy-chain connection;
a second communication interface coupled to the channel data registers via respective parallel connections; and
routing interfaces including a routing interface for each of the channel signal chains, each of the routing interfaces having a routing data input, a daisy-chain connection input, a parallel connection input, first and second control inputs, and a routing data output.

2. The circuit of claim 1, wherein each routing interface includes a routing controller, each routing controller having a third control input, a routing output and first and second routing inputs, each first routing input coupled to a respective daisy-chain connection input, each second routing input coupled to a respective parallel connection input, and each third control input coupled to a respective first control input.

3. The circuit of claim 2, wherein each routing interface includes a multiplexer, each multiplexer having a fourth control input, a multiplexer output and first and second multiplexer inputs, each fourth control input coupled to a respective second control input, each first multiplexer input coupled to a respective routing output, each second multiplexer input coupled to a respective routing data input, and each multiplexer output coupled to a respective routing data output.

4. The circuit of claim 3, wherein each routing controller includes a data shifting interface configured to shift data from a respective configuration register to a respective first multiplexer input in response to a respective routing interface receiving a test mode control signal at a respective first control input.

5. The circuit of claim 3, wherein each multiplexer is a first multiplexer, each multiplexer output is a first multiplexer output, each routing controller includes a second multiplexer, each second multiplexer having a fifth control input, a second multiplexer output and third and fourth multiplexer inputs, each fifth control input coupled to a respective third control input, each third multiplexer input coupled to a respective first routing input, each second multiplexer input coupled to a respective second routing input, and each second multiplexer output coupled to a respective routing output.

6. The circuit of claim 5, wherein each routing controller is configured to route data from a respective first routing input to a respective routing output in response to a respective routing interface receiving a test mode control signal at a respective first control input.

7. The circuit of claim 1, further comprising:
a first controller coupled to the first communication interface, the first controller configured to read from and write to each of the configuration registers via the daisy-chain connection; and
a second controller coupled to the second communication interface, the second controller configured to read from each of the channel data registers via a respective parallel connection.

8. The circuit of claim 1, further comprising:
a scan controller having a scan data input, a scan clock input, a scan clock output, a third control input, a bypass control output and a scan data output; and
scan path multiplexers including a scan path multiplexer for each of the channel signal chains, each scan path multiplexer having a fourth control input, a multiplexer output and first and second multiplexer inputs, each respective first multiplexer input coupled to a respective bypass path, each respective second multiplexer input coupled to a respective scan chain.

9. The circuit of claim 8, wherein the bypass control output is a first bypass control output and the circuit further comprises a bypass register chain having a fifth control input and second bypass control outputs, the fifth control input coupled to the first bypass control output, and the second bypass control outputs coupled to respective fourth control inputs.

10. The circuit of claim 8, wherein the scan controller is configured to:
provide a scan clock received at the scan clock input to the scan clock output in response to a good channel indication received at the third control input;
gate the scan clock received at the scan clock input in response to a bad channel indication received at the third control input; and
provide a bypass control signal at the bypass control output in response to a bad channel indication received at the third control input.

11. The circuit of claim 1, further comprising:
fuses including a fuse for each channel signal chain; and
a fuse controller coupled to each of the fuses, wherein the fuse controller is configured to selectively blow each of the fuses based on channel signal chain test mode results obtained via the routing interfaces.

12. The circuit of claim 1, wherein each of the channel signal chains includes a charge input, and each of channel signal chains is configured to receive a sensor charge signal at its respective charge input.

13. A method comprising:
obtaining test mode data related to a channel signal chain of an integrated circuit;
routing the test mode data from a daisy-chain connection of the channel signal chain to a parallel connection in response to a test mode control signal;

identifying the channel signal chain as good or bad based on the routed test mode data; and
bypassing a scan test of the channel signal chain if the channel signal chain is identified as bad.

14. The method of claim 13, wherein the routing the test mode data from the daisy-chain connection of the channel signal chain to the parallel connection involves a register data shift operation responsive to the test mode control signal.

15. The method of claim 13, wherein the routing the test mode data from the daisy-chain connection of the channel signal chain to the parallel connection involves a multiplexing operation responsive to the test mode control signal.

16. The method of claim 13, wherein bypassing the scan test involves gating a scan clock.

17. The method of claim 13, wherein bypassing the scan test involves generating a bypass control signal to a scan path multiplexer.

18. The method of claim 13, further comprising blowing a fuse related to the channel signal chain.

19. The method of claim 13, further comprising:
repeating the obtaining, routing, and identifying steps for different channel signal chains of the integrated circuit to obtain test mode results;
identifying the integrated circuit as good or bad based on the test mode results and a target channel yield; and
if the integrated circuit is identified as good, performing a scan test for channel signal chains of the integrated circuit identified as good and bypassing the scan test for channel signal chains identified as bad.

20. The method of claim 19, further comprising padding scan output data based on a position of each bad channel signal chain of the integrated circuit relative to other channel signal chains of the integrated circuit.

* * * * *